(12) United States Patent
Sato et al.

(10) Patent No.: US 11,079,403 B2
(45) Date of Patent: Aug. 3, 2021

(54) PHYSICAL QUANTITY SENSOR MODULE, CLINOMETER, AND STRUCTURE MONITORING DEVICE

(71) Applicant: Seiko Epson Corporation, Tokyo (JP)

(72) Inventors: Kenta Sato, Shiojiri (JP); Masayoshi Todorokihara, Suwa (JP)

(73) Assignee: Seiko Epson Corporation

( * ) Notice: Subject to any disclaimer, the term of this patent is extended or adjusted under 35 U.S.C. 154(b) by 216 days.

(21) Appl. No.: 16/389,098

(22) Filed: Apr. 19, 2019

(65) Prior Publication Data

US 2019/0324052 A1    Oct. 24, 2019

(30) Foreign Application Priority Data

Apr. 20, 2018   (JP) .............................. JP2018-081177

(51) Int. Cl.

| | |
|---|---|
| *G01P 15/097* | (2006.01) |
| *G01P 15/08* | (2006.01) |
| *G01C 9/02* | (2006.01) |
| *H03M 3/00* | (2006.01) |

(52) U.S. Cl.
CPC .............. *G01P 15/097* (2013.01); *G01C 9/02* (2013.01); *G01P 15/0802* (2013.01); *H03M 3/378* (2013.01)

(58) Field of Classification Search
CPC ............................ G01P 15/097; G01P 15/0802

USPC ..................................................... 73/514.29
See application file for complete search history.

(56) References Cited

U.S. PATENT DOCUMENTS

2006/0065039 A1    3/2006  Rojo et al.

FOREIGN PATENT DOCUMENTS

| JP | H07-120498 A | 5/1995 |
|---|---|---|
| JP | H09-033563 A | 2/1997 |
| JP | 2008-514959 A | 5/2008 |
| WO | WO-2006-036897 A1 | 4/2006 |

*Primary Examiner* — John Fitzgerald
*Assistant Examiner* — Rodney T Frank
(74) *Attorney, Agent, or Firm* — Harness, Dickey & Pierce, P.L.C.

(57) ABSTRACT

A physical quantity sensor module includes: a resonant frequency shift based physical quantity sensor whose frequency adjusts with a adjust in physical quantity; a reference signal oscillator which outputs a reference signal; a frequency delta-sigma modulator which performs frequency delta-sigma modulation of the reference signal, using an operation signal based on a measurement target signal as an output from the resonant frequency shift based physical quantity sensor, and generates a frequency delta-sigma modulated signal; a first low-pass filter provided on an output side of the frequency delta-sigma modulator and operating synchronously with the measurement target signal as the output from the resonant frequency shift based physical quantity sensor; and a second low-pass filter provided on an output side of the first low-pass filter and operating synchronously with the reference signal.

10 Claims, 12 Drawing Sheets

PHYSICAL QUANTITY SENSOR MODULE, CLINOMETER, AND STRUCTURE MONITORING DEVICE

The present application is based on, and claims priority from Japanese Application Serial Number 2018-081177, filed Apr. 20, 2018, the disclosure of which is hereby incorporated by reference herein in its entirety.

BACKGROUND

1. Technical Field

The present disclosure relates to a physical quantity sensor module and the like.

2. Related Art

A physical quantity sensor forming a physical quantity sensor module for detecting a physical quantity such as acceleration has a problem of nonlinearity in that the relation between the physical quantity and the output value is not linear. To correct this nonlinearity, for example, providing a nonlinearity correction circuit for changing the degree of amplification of output for an electrostatic capacitance-type physical quantity sensor, which is a type of physical quantity sensor and which detects an acceleration, is known. JP-A-9-33563 is an example of the related art.

However, providing a dedicated circuit or a dedicated mechanism such as providing a nonlinearity correction circuit has a problem in that it increases the circuit scale of the physical quantity sensor module and consequently increases the cost.

SUMMARY

An advantage of some aspects of the present disclosure is to solve at least a part of the foregoing problem and the present disclosure can be implemented as the following configurations or application examples.

A first aspect of the disclosure is directed to a physical quantity sensor module including: a resonant frequency shift based physical quantity sensor whose frequency adjusts with a adjust in physical quantity; a reference signal oscillator which outputs a reference signal; a frequency delta-sigma modulator which performs frequency delta-sigma modulation of the reference signal, using an operation signal based on a measurement target signal outputted from the resonant frequency shift based physical quantity sensor, and generates a frequency delta-sigma modulated signal; a first filter provided at an output of the frequency delta-sigma modulator and operating synchronously with the measurement target signal; a second filter provided on an output side of the first filter and operating synchronously with the reference signal; and a latch provided between the first filter and the second filter and operating synchronously with the reference signal. The resonant frequency shift based physical quantity sensor has nonlinearity as a characteristic of an output signal to the physical quantity.

According to the first aspect, the filter provided on the output side of the frequency delta-sigma modulator includes a combination of the first filter operating synchronously with the measurement target signal as an output from the resonant frequency shift based physical quantity sensor, and the second filter operating synchronously with the reference signal. This enables correction of the nonlinearity of the measurement target signal. Therefore, a dedicated circuit or a dedicated mechanism such as a nonlinearity correction circuit need not be provided. Thus, the nonlinearity of the measurement target signal outputted from the physical quantity sensor can be corrected without increasing the size of the physical quantity sensor module and with a low cost.

A second aspect of the disclosure is directed to the physical quantity sensor module according to the first aspect, in which a cutoff frequency which is a filter characteristic achieved by a combination of the first filter and the second filter is lower than a structure resonance frequency of the resonant frequency shift based physical quantity sensor.

According to the second aspect, the first filter and the second filter can reduce a noise component resulting from the structure resonance frequency where a vibration rectification error emerges prominently.

A third aspect of the disclosure is directed to the physical quantity sensor module according to the second aspect, in which the structure resonance frequency is a frequency determined based on a structure of the resonant frequency shift based physical quantity sensor.

According to the third aspect, the structure resonance frequency can be determined based on the structure of the resonant frequency shift based physical quantity sensor.

A fourth aspect of the disclosure is directed to the physical quantity sensor module according to one of the first to third aspects, in which the first filter has an input/output characteristic set in such a way that the nonlinearity of the measurement target signal as the output from the resonant frequency shift based physical quantity sensor becomes closer to linearity.

According to the fourth aspect, the measurement target signal as the output from the resonant frequency shift based physical quantity sensor is passed through the first filter and the nonlinearity of the measurement target signal is thus corrected to become closer to linearity. The resulting signal is used as the output from the physical quantity sensor module.

A fifth aspect of the disclosure is directed to the physical quantity sensor module according to the fourth aspect, in which the first filter is a smoothing filter configured to adjust a smoothing timing based on a number of filter taps, and the number of filter taps is set to a smoothing timing that reduces a vibration rectification error of the measurement target signal as the output from the resonant frequency shift based physical quantity sensor emerging due to the nonlinearity.

According to the fifth aspect, the smoothing timing of the first filter as the smoothing filter is adjusted by the number of filter taps. This reduces the vibration rectification error of the measurement target signal as the output from the resonant frequency shift based physical quantity sensor. Thus, the nonlinearity of the measurement target signal can be corrected.

A sixth aspect of the disclosure is directed to the physical quantity sensor module according to the fifth aspect, in which a setting of the number of filter taps is adjustable from outside.

According to the sixth aspect, the setting of the number of filter taps of the first filter is adjustable from outside. Therefore, for each physical quantity sensor module, the number of filter taps of the first filter can be properly set or reset according to the characteristic of the resonant frequency shift based physical quantity sensor.

A seventh aspect of the disclosure is directed to the physical quantity sensor module according to the fifth or sixth aspect, in which the first filter is configured to adjust the smoothing timing based on a plurality of numbers of filter taps with different levels of roughness/fineness of an amount of adjust in the smoothing timing.

According to the seventh aspect, the plurality of numbers of filter taps with different levels of roughness/fineness of the amount of adjust in the smoothing timing makes it easy to adjust the degree of correction of the nonlinearity of the measurement target signal as the output from the resonant frequency shift based physical quantity sensor.

An eighth aspect of the disclosure is directed to the physical quantity sensor module according to one of the first to fifth aspects, in which the physical quantity is acceleration.

According to the eighth aspect, the physical quantity sensor module which detects an acceleration can achieve the advantageous effects of the first to fifth aspects.

A ninth aspect of the disclosure is directed to a clinometer including: the physical quantity sensor module according to the eighth aspect; and a calculator which calculates an angle of inclination based on an output from the physical quantity sensor module.

According to the ninth aspect, a clinometer with a higher accuracy of calculation of the angle of inclination than in the related art can be achieved.

A tenth aspect of the disclosure is directed to an inertial measurement device equipped on a vehicle including: the physical quantity sensor module according to the eighth aspect; an angular velocity physical quantity sensor module; and a circuitry which calculates an attitude of the vehicle, based on an output from the physical quantity sensor module and an output from the angular velocity physical quantity sensor module.

According to the tenth aspect, an inertial measurement device with a higher accuracy of calculation of the attitude of the vehicle than in the related art can be achieved.

An eleventh aspect of the disclosure is directed to a structure monitoring device including: the physical quantity sensor module according to the eighth aspect equipped on a structure; a transmitter which is equipped on the structure and transmits an output from the physical quantity sensor module; a receiver which receives a signal transmitted from the transmitter; and a calculator which calculates an angle of inclination of the structure, based on a signal received by the receiver.

According to the eleventh aspect, a structure monitoring device with a higher accuracy of calculation of the angle of inclination of the structure than in the related art can be achieved.

A twelfth aspect of the disclosure is directed to a vehicle including: the physical quantity sensor module according to the eighth aspect; and a controller which controls at least one of acceleration, braking, and steering, based on an output signal from the physical quantity sensor module. Whether to execute automatic driving or not is switched, based on an output from the physical quantity sensor module.

According to the twelfth aspect, a vehicle with higher quality of automatic driving than in the related art can be achieved.

DESCRIPTION OF EXEMPLARY EMBODIMENTS

Suitable embodiments of the disclosure will now be described with reference to the drawings. However, the following embodiments should not limit the disclosure and should not limit any form to which the disclosure is applicable.

First Embodiment

Configuration

Figure 1:
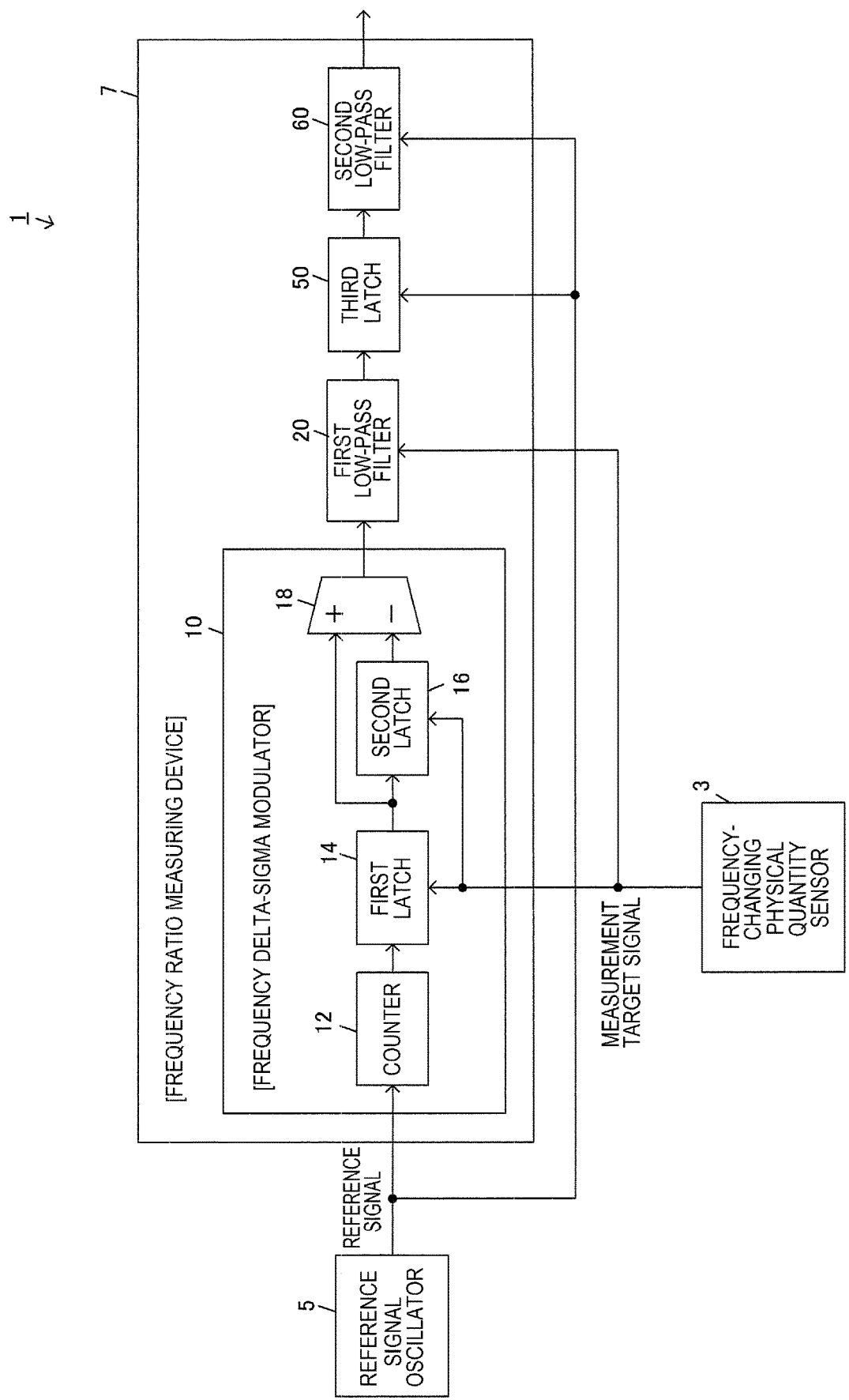
FIG. 1 is a block diagram showing the configuration of a physical quantity sensor module according to a first embodiment.

FIG. 1 is a block diagram showing the configuration of a physical quantity sensor module 1 according to a first embodiment. As shown in FIG. 1, the physical quantity sensor module 1 has a resonant frequency shift based physical quantity sensor 3, a reference signal oscillator 5, and a frequency ratio measuring device 7. The resonant frequency shift based physical quantity sensor 3 is a physical quantity sensor whose frequency adjusts according to an adjust in a detection target physical quantity. The resonant frequency shift based physical quantity sensor 3 outputs a periodic signal corresponding to the frequency, as a measurement target signal. The resonant frequency shift based physical quantity sensor 3 may be, for example, a quartz crystal velocity physical quantity sensor which measures an acceleration as a physical quantity, or may be a quartz crystal angular velocity physical quantity sensor which measures an angular velocity as a physical quantity. The reference signal oscillator 5 outputs a reference signal based on a predetermined frequency. The frequency of the reference signal is higher than the frequency of the measurement target signal.

The frequency ratio measuring device 7 is a device which measures the frequency ratio between the measurement target signal and the reference signal, based on the measurement target signal and the reference signal. The frequency ratio measuring device 7 measures the frequency ratio by a reciprocal counting method. Instead of the measurement target signal, an operation signal based on the measurement target signal may be used. The operation signal based on the measurement target signal is a signal correlated with the measurement target signal and includes the measurement target signal itself. The frequency ratio measuring device 7 has a frequency delta-sigma modulator 10, a first low-pass filter 20, a third latch 50, and a second low-pass filter 60.

The frequency delta-sigma modulator 10 performs frequency delta-sigma modulation of the reference signal outputted from the reference signal oscillator 5, using the measurement target signal as the output from the resonant frequency shift based physical quantity sensor 3, and generates a frequency delta-sigma modulated signal. The frequency delta-sigma modulator 10 has a counter 12, a first latch 14, a second latch 16, and a subtractor 18. The counter 12 counts a rising edge of the reference signal and outputs count data representing a count value. The first latch 14 latches the count data and outputs first data, synchronously with a rising edge of the measurement target signal. The second latch 16 latches the first data and outputs second data, synchronously with the rising edge of the measurement target signal. The subtractor 18 subtracts the second data from the first data and generates output data. This output is the frequency delta-sigma modulated signal generated by the frequency delta-sigma modulator 10.

The frequency delta-sigma modulator 10 is also called a first-order frequency delta-sigma modulator. The frequency delta-sigma modulator 10 latches the count value of the reference signal twice by the measurement target signal and sequentially holds the count value of the reference signal, triggered by the rising edge of the measurement target signal. Although it is assumed in this example that the latch operation is carried out at the rising edge, the latch operation may be carried out at a falling edge or both at the rising edge and at the falling edge. The subtractor 18 calculates the difference between the two count values thus held, and outputs an increase in the count value of the reference signal observed during a one-period transition of the measurement target signal, without any dead time with the lapse of time. The frequency ratio is fc/fx, where fx is the frequency of the measurement target signal and fc is the frequency of the reference signal. The frequency delta-sigma modulator 10 outputs the frequency delta-sigma modulated signal representing the frequency ratio, as a digital signal string.

The first low-pass filter 20 is an example of a first filter and is provided on the output side of the frequency delta-sigma modulator 10. The first low-pass filter 20 operates synchronously with the measurement target signal as the output from the resonant frequency shift based physical quantity sensor 3 and eliminates or reduces a noise component included in the frequency delta-sigma modulated signal outputted from the frequency ratio measuring device 7.

The third latch 50 latches and outputs the output from the first low-pass filter 20 synchronously with the rising edge of the reference signal.

The second low-pass filter 60 is an example of a second filter and is provided on the output side of the first low-pass filter 20, which is an example of the first filter. The second low-pass filter 60 operates synchronously with the reference signal and eliminates or reduces a noise component included in the frequency delta-sigma modulated signal outputted from the frequency ratio measuring device 7.

Principles

The frequency ratio measuring device 7 in this embodiment corrects the nonlinearity of the measurement target signal as the output from the resonant frequency shift based physical quantity sensor 3. If the resonant frequency shift based physical quantity sensor 3 is, for example, a quartz crystal acceleration physical quantity sensor, the resonant frequency shift based physical quantity sensor 3 is a physical quantity sensor utilizing a adjust in the oscillation frequency (vibration frequency) of a quartz crystal vibrator corresponding to a adjust in a force acting along a detection axis. The resonant frequency shift based physical quantity sensor 3 outputs a signal changing in a pulse-like form corresponding to the oscillation frequency. The relation between the acting acceleration and the oscillation frequency of the quartz crystal vibrator is not perfectly linear (nonlinear). The relation varies from one sensor to another.

Figure 2:
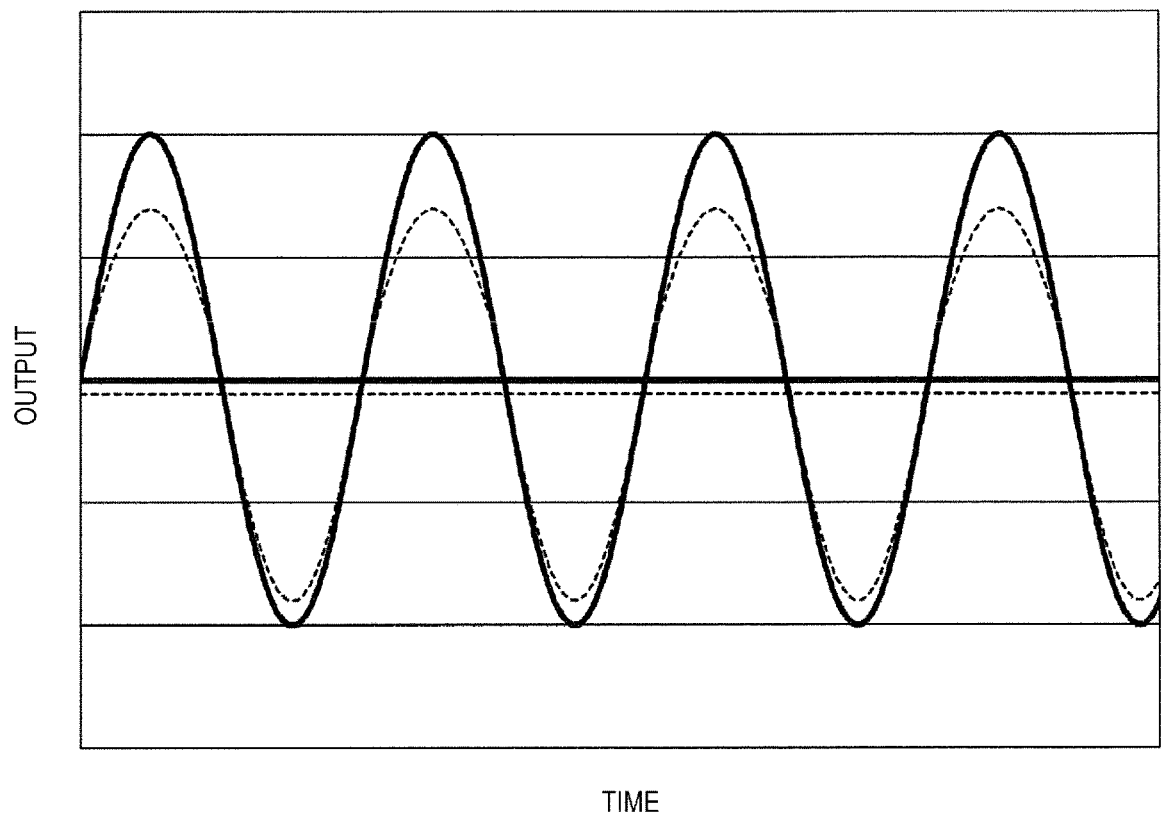
FIG. 2 is an explanatory view of vibration rectification error.

FIG. 2 is a schematic view for explaining the way a drift occurs in a DC component of an output value when a vibration component is inputted to a system having a nonlinear input/output relation. Inputting a sinusoidal signal to a system having a linear input/output relation results in an output value indicated by a solid curve in FIG. 2. No drift occurs in a DC component (solid straight line) obtained by rectifying this output value. Meanwhile, inputting a sinusoidal signal to a system having a nonlinear input/output relation results in an output value indicated by a dashed curve in FIG. 2. Adrift due to a distortion of output waveform occurs in a DC component (dashed straight line) obtained by rectifying this output value. The drift component generated in the output when a vibration component is inputted to the system having the nonlinear input/output relation is called a vibration rectification error (VRE). Generally, the VRE is a function of the frequency of the inputted vibration component. It is known that the magnitude of the VRE is proportionate to the square of the amplitude of the inputted vibration component, provided that the frequency of the inputted vibration component is constant.

Figure 3:
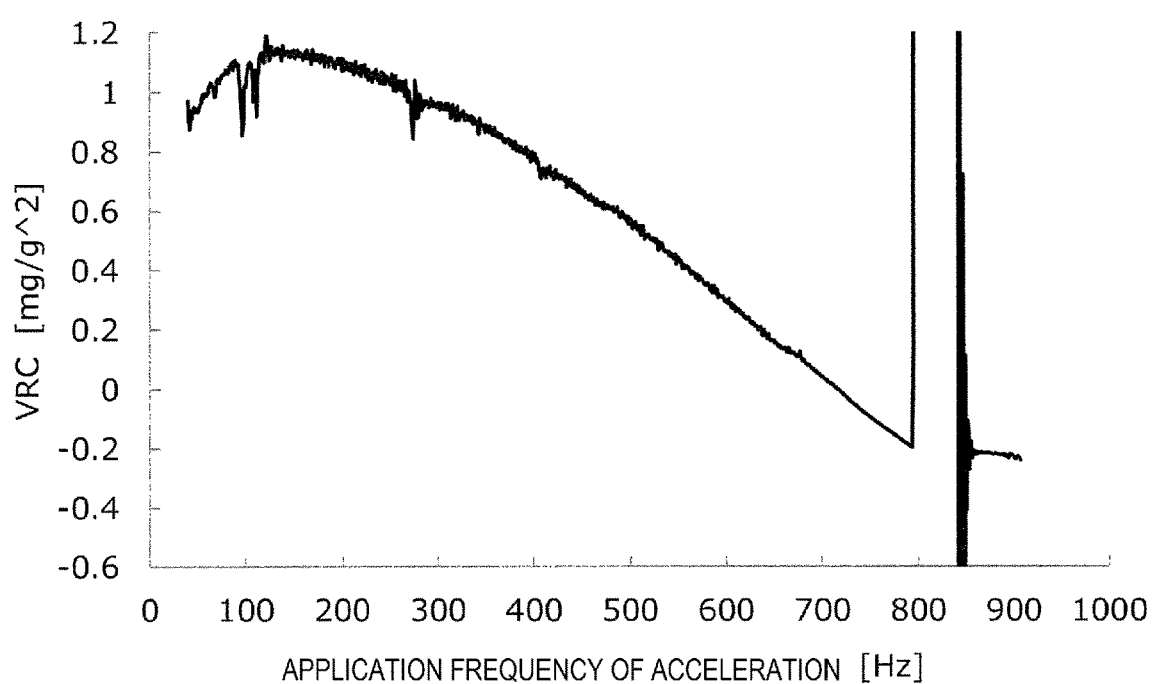
FIG. 3 is an explanatory view of structure resonance frequency.

FIG. 3 shows a vibration rectification error constant (VRC) traced as a function of the application frequency of applied acceleration in the pre-adjustment physical quantity sensor module 1 configured to detect an acceleration. Since the magnitude of the VRE is proportionate to the square of the amplitude of the inputted vibration component, the VRC in the physical quantity sensor module configured to detect an acceleration is expressed in $[G/G^2]$. A VRC peak observed near 820 Hz has a value greater by four to five digits than in the other frequency regions. This is due to the following reason. That is, the structure resonance frequency of structure resonance determined by the structure of the physical quantity sensor module is approximately 820 Hz, and a frequency of approximately 820 Hz, if included in the inputted vibration component, causes structure resonance of the physical quantity sensor module. Thus, apparently, the frequency component corresponding to the structure resonance frequency is amplified and outputted. Consequently, a drift due to the structure resonance contributes most to the VRE. Thus, a special countermeasure is needed.

The frequency ratio measuring device 7 corrects the measurement target signal as the output from the resonant frequency shift based physical quantity sensor 3 having nonlinearity. The frequency ratio measuring device 7 particularly reduces the VRE due to the structure resonance and thus can reduce the nonlinearity between the acceleration acting on the resonant frequency shift based physical quantity sensor 3 and the output from the frequency ratio measuring device 7.

Figure 4:
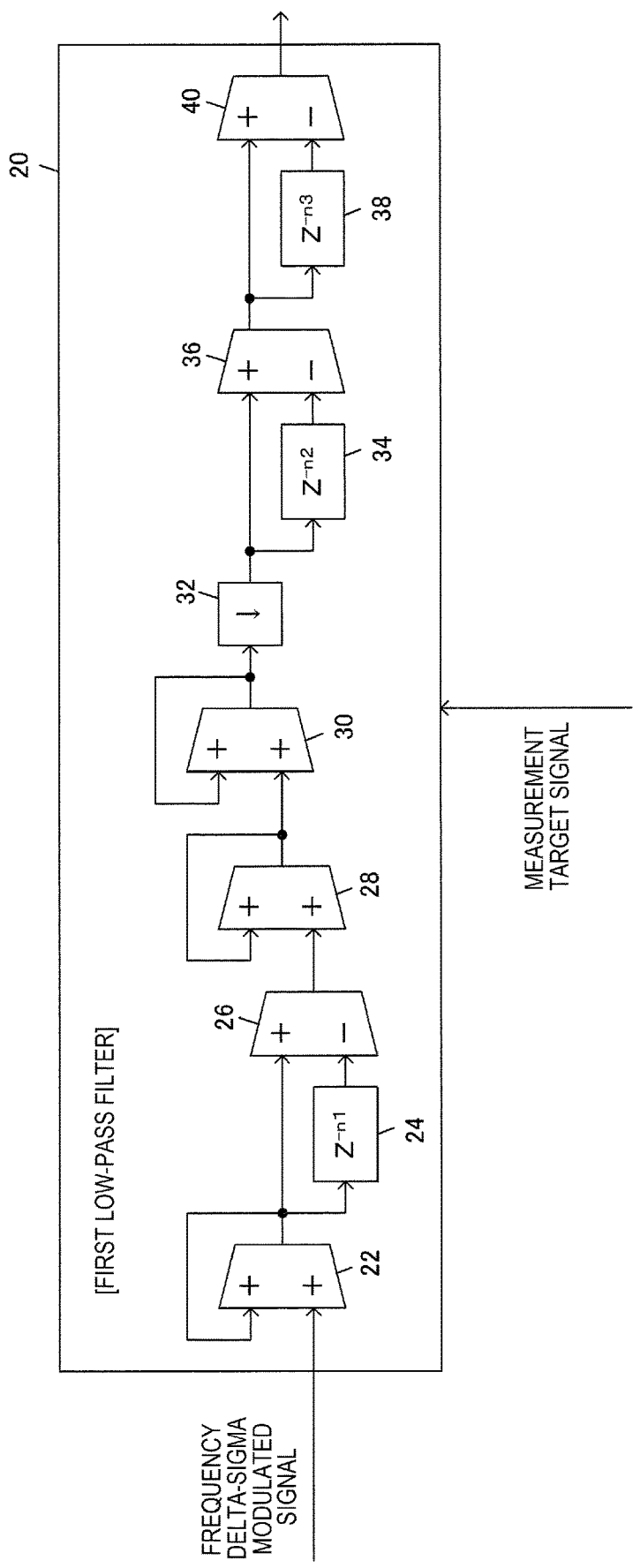
FIG. 4 is a block diagram showing the configuration of a first low-pass filter in the first embodiment.

FIG. 4 is a block diagram showing the configuration of the first low-pass filter 20. As shown in FIG. 4, the first low-pass filter 20 has a first adder 22, a first delay element 24, a first subtractor 26, a second adder 28, a third adder 30, a decimator 32, a second delay element 34, a second subtractor 36, a third delay element 38, and a third subtractor 40. Each part of the first low-pass filter 20 operates synchronously with the measurement target signal. The setting of the numbers of delays n1 to n3 of the first delay element 24, the second delay element 34, and the third delay element 38, respectively, as the numbers of filter taps, can be adjusted from outside the physical quantity sensor module 1. Of the components of the first low-pass filter 20, a first section made up of the first adder 22, the first delay element 24, and the first subtractor 26 functions as a moving average filter. Of the components of the first low-pass filter 20, a second section made up of the second adder 28, the third adder 30, the decimator 32, the second delay element 34, the second subtractor 36, the third delay element 38, and the third subtractor 40 function as a cascaded integrator-comb (CIC) filter.

Figure 5:
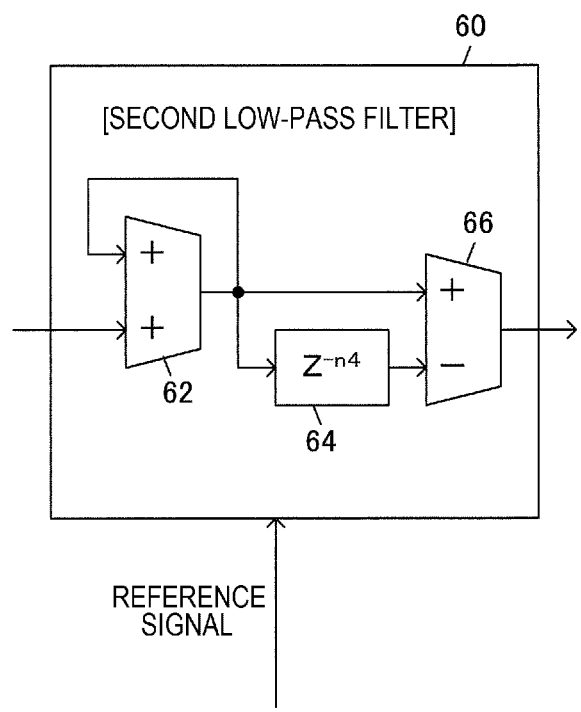
FIG. 5 is a block diagram showing the configuration of a second low-pass filter in the first embodiment.

FIG. 5 is a block diagram showing the configuration of the second low-pass filter 60. As shown in FIG. 5, the second low-pass filter 60 has a fourth adder 62, a fourth delay element 64, and a fourth subtractor 66. Each part of the second low-pass filter 60 operates synchronously with the reference signal. The setting of the number of delays n4 of the fourth delay element 64, as the number of filter taps, can be adjusted from outside the physical quantity sensor module 1. The second low-pass filter 60 functions as a moving average filter.

The setting of the numbers of filter taps n1 to n3 of the first low-pass filter 20 and the number of filter taps n4 of the second low-pass filter 60 thus configured realizes the nonlinearity of the input/output characteristic of the frequency ratio measuring device 7. Specifically, based on a characteristic such that the phase of an output is delayed by (n1−1+R×(n2+n3−1))/2 clocks from an input to the first low-pass filter 20 operating based on the measurement target signal, where R is the decimation ratio of the CIC filter, and by taking out and smoothing the output from the first low-pass filter 20 by the number of samples n4 via the second low-pass filter 60 operating based on the reference signal, the nonlinearity of the input/output characteristic is realized. The first low-pass filter 20 functions as a cascaded moving average filter and the second low-pass filter 60 functions as a moving average filter, thus smoothing and outputting an input signal. In the first low-pass filter 20 and the second low-pass filter 60, changing the numbers of delays n1 to n4 of the receptive delay elements can adjust the cutoff frequency and the smoothing timing. The cutoff frequency achieved by a combination of the first low-pass filter 20 and the second low-pass filter 60, of the resonant frequency shift based physical quantity sensor 3, is prescribed to be lower than the structure resonance frequency of the resonant frequency shift based physical quantity sensor 3. Therefore, the influence of the structure resonance on output modulation can be reduced.

Figure 6:
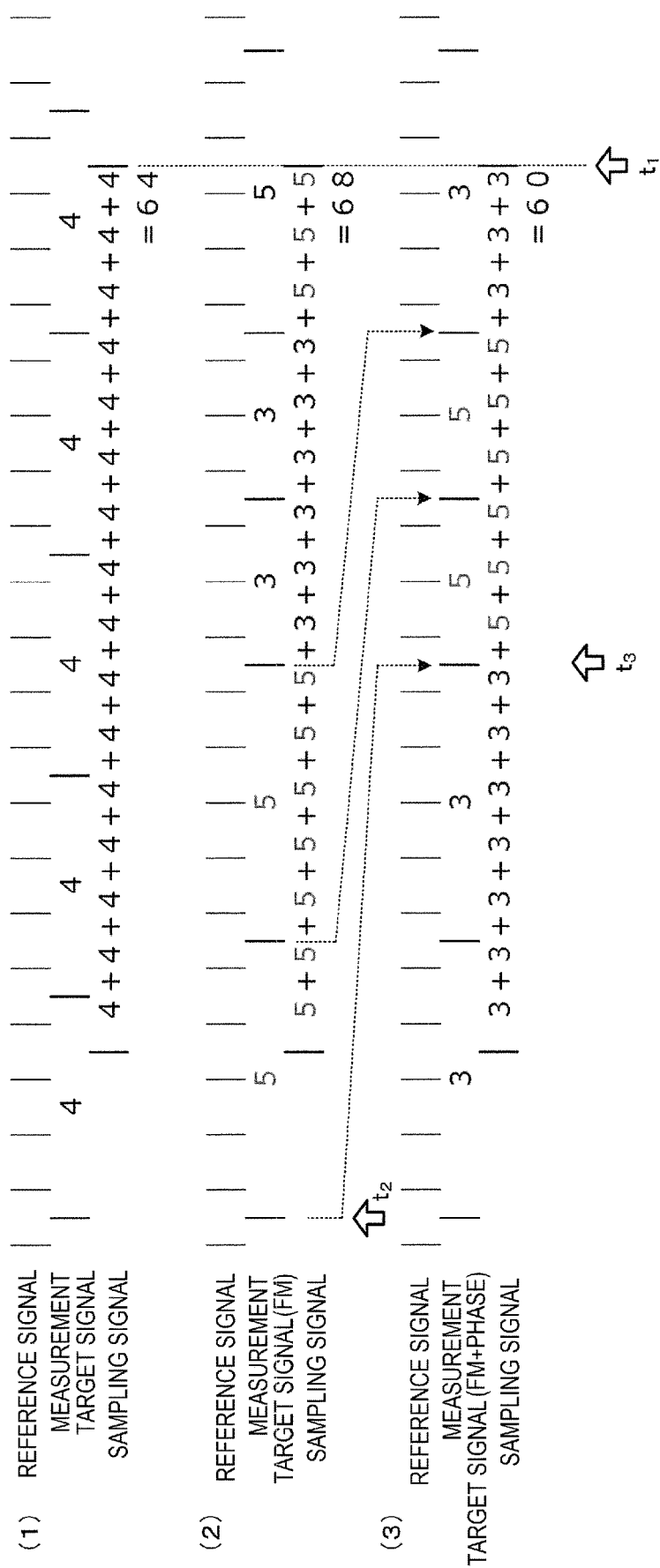
FIG. 6 is an explanatory view of nonlinearity in the first embodiment.

FIG. 6 is a schematic view for explaining a principle on how the frequency ratio measuring device 7 shows nonlinearity (vibration rectification error) to a vibration input, due to the input/output characteristic based on the first low-pass filter 20 and the second low-pass filter 60. In sections (1) to (3) of FIG. 6 relating to frequency, time passes as it goes to the right on the sheet, and the reference signal, the measurement target signal, and the sampling signal are shown in order from the top. For the reference signal and the measurement target signal, the timing of a rising edge is indicated by a short vertical line. For the measurement target signal, a numeric value representing the output signal of the first low-pass filter 20 operating at the timing of the rising edge of the measurement target signal is also written between the timings of the receptive rising edges. For the sake of convenience of qualitative explanation, the reference signal, the measurement target signal, and the sampling signal are illustrated in such a way that the frequencies (periods) of these signals form a simple ratio, and an input value where only the phase difference is varied is illustrated as a first low-pass filter output value. However, in the description below, it should be noted that a similar explanation can be given even when an arbitrary first low-pass filter output value is used in an arbitrary frequency ratio.

The sampling signal is a signal outputted from the second low-pass filter 60. The second low-pass filter 60 takes in, at the timing of the rising edge of the reference signal, the output signal from the first low-pass filter 20 via the third latch 50 similarly operating synchronously with the reference signal, and outputs the result of smoothing. In FIG. 6, focusing on one operation timing t1, a start point and an end point of a smoothing period are indicated by a short vertical line, and a numeric value representing an output signal is shown along with the progress of smoothing. The length of the smoothing period is determined by a clock period based on the reference signal, and the number of delays n4 of the fourth delay element 64 of the second low-pass filter 60.

The first low-pass filter 20 takes in the output signal from the frequency delta-sigma modulator 10 at the timing of the rising edge of the measurement target signal and outputs the result of smoothing. The frequency delta-sigma modulated signal as the output signal from the frequency delta-sigma modulator 10 is the frequency ratio fc/fx between the frequency fx of the measurement target signal and the frequency fc of the reference signal. That is, the first low-pass filter 20 carries out smoothing of the frequency ratio fc/fx between the measurement target signal and the reference signal. The length of the smoothing period and the amount of delay are determined by a clock period based on the measurement target signal, and the numbers of delays n1, n2, and n3 of the first delay element 24, the second delay element 34, and the third delay element 38 of the first low-pass filter 20.

The part (1) of FIG. 6 shows an example where the ratio (reciprocal count value) between the frequency fc of the reference signal and the frequency fx of the measurement target signal inputted to the frequency ratio measuring device 7 is a constant integer value. If the ratio between fc and fx is a constant integer value, the result of smoothing by the first low-pass filter 20 is a constant value corresponding to the frequency fx of the measurement target signal. For the sake of convenience of the description, in the part (1) of FIG. 6, the number of rising edges of the reference signal included between the timings of rising edges of the measurement target signal, "4", is shown as a numeric value representing the output signal.

The second low-pass filter 60 takes in the output signal from the first low-pass filter 20 at the rising timing of the reference signal and outputs the result of smoothing. In FIG. 6, a value obtained simply by accumulating values taken in during the smoothing period is shown as the result of smoothing by the second low-pass filter 60. The sampling signal in this example is "64".

The part (2) of FIG. 6, unlike the part (1) of FIG. 6, shows an example where the measurement target signal is FM (frequency modulation) modulated while the total sum of reciprocal count values in the repetition section of the measurement target signal is maintained, and where the numbers of delays n1, n2, and n3 of the first delay element 24, the second delay element 34, and the third delay element 38 of the first low-pass filter 20 are subsequently adjusted in such a way that the input and the output are in phase. Due to FM modulation, the timing of the rising edge of the measurement target signal periodically adjusts and the output value from the first low-pass filter 20 as the result of smoothing periodically adjusts, too. In the part (2) of FIG. 6, the reciprocal count value, too, adjusts to "5" or "3". Since the second low-pass filter 60 accumulates "5" or "3" based on the reference signal, the reciprocal count value is weighted according to timing. In the part (2) of FIG. 6, the input and the output are adjusted to be in phase. Therefore, the greater the reciprocal count value is, the more it is weighted. The sampling signal in this example is "68".

The part (3) of FIG. 6 shows an example where the numbers of delays n1, n2, and n3 of the first delay element 24, the second delay element 34, and the third delay element 38 of the first low-pass filter 20 are adjusted in such a way that the input and the output are of the opposite phases, when the measurement target signal is FM-modulated as in the part (2) of FIG. 6.

Similarly to the part (2) of FIG. 6, the timing of the rising edge of the measurement target signal periodically adjusts due to FM modulation, and the output value from the first low-pass filter 20 as the result of smoothing periodically adjusts, too. In the part (3) of FIG. 6, the reciprocal count value, too, adjusts to "5" or "3" but of the opposite phase to the part (2) of FIG. 6. Again, the second low-pass filter 60 accumulates "5" or "3" based on the reference signal and therefore the reciprocal count value is weighted according to timing. However, in the part (3) of FIG. 6, the input and the output are adjusted to be of the opposite phases. Therefore, the smaller the reciprocal count value is, the more it is weighted. The sampling signal in this example is "60".

Generally, FM (frequency modulation) modulating the measurement target signal and then adjusting the phase of the input and the phase of the output can control the amount of drift of the DC component of the sampling signal as the output from the second low-pass filter. In the example of FIG. 6, the sampling signal without any drift is "64", and the sampling signal can be adjusted to "68" (the amount of drift being the maximum "+4") by bringing the input and the output of the first low-pass filter into phase, and "60" (the amount of drift being the minimum "−4") by bringing the input and the output of the first low-pass filter into the opposite phases. Also, adjusting the phase in the first low-pass filter can control the amount of drift to an intermediate value between these values.

Based on the foregoing mechanism, providing a mechanism for adjusting the output timing of the first low-pass filter can adjust the output signal from the second low-pass filter 60. Therefore, the amount of drift can be controlled without changing the cutoff frequency.

When the frequency (period) of the measurement target signal does not adjust, as shown in the part (1) of FIG. 6, even though the output timing of the first low-pass filter 20 is delayed, the length of the smoothing period by the first low-pass filter 20 and the result of the smoothing are not adjusted by the output timing and therefore the output from the second low-pass filter 60 does not adjust.

Changing the setting of the numbers of delays n2 and n3 of the second delay element 34 and the third delay element 38 of the first low-pass filter 20 in this way can delay the output timing of the first low-pass filter 20. Thus, the input/output characteristic, which is the relation between the frequency of the measurement target signal inputted to the frequency ratio measuring device 7 and the frequency of the output signal, shows nonlinearity and the amount of drift can thus be controlled.

In the foregoing example, the amount of drift (0→±4) is discussed on the assumption that the measurement target signal is FM (frequency modulation) modulated (reciprocal count value being 4, 4, 4, 4, →5, 5, 3, 3) while the total sum of reciprocal count values in the repetition section of the measurement target signal is maintained. However, when the amount of FM modulation is doubled (reciprocal count value being 4, 4, 4, 4, →6, 6, 2, 2), the amount of drift is 0→±16. Thus, it can be understood that the amount of drift is proportionate to the square of the amount of FM modulation. Meanwhile, when the frequency of the inputted vibration component is constant, the magnitude of the vibration rectification error in the output from the resonant frequency shift based physical quantity sensor 3 is proportionate to the square of the amplitude of the inputted vibration component. Therefore, adjusting the amount of drift to cancel the vibration rectification error can bring the input/output relation of the physical quantity sensor module 1 close to linearity.

Experiment Result

Figure 7:
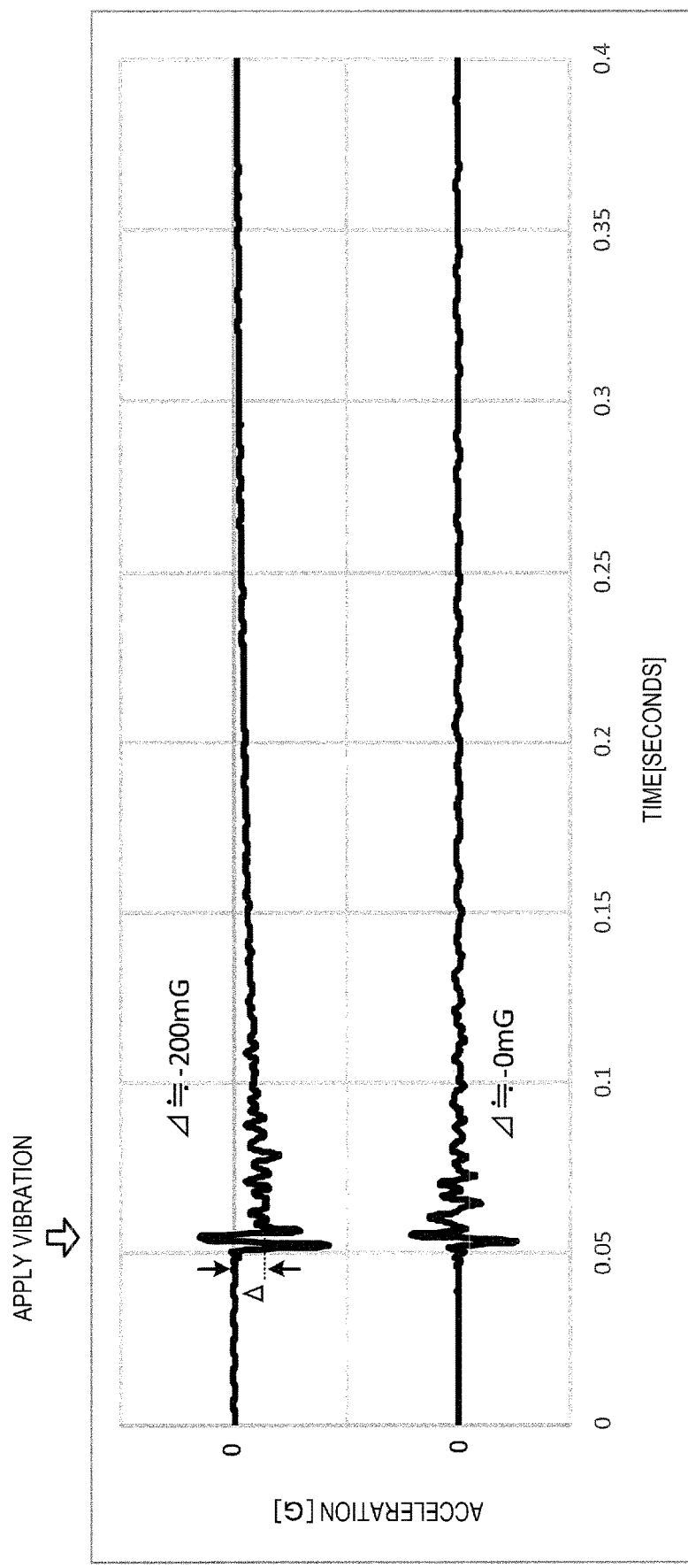
FIG. 7 shows an example of an experiment result in the first embodiment.

Next, the result of an experiment on the physical quantity sensor module 1 will be described. FIG. 7 shows an example of the result of the experiment. In FIG. 7, the horizontal axis represents time and the vertical axis represents acceleration, and an output from the frequency ratio measuring device 7 when a vibration and hence an acceleration is instantaneously applied to the resonant frequency shift based physical quantity sensor 3, is shown. When an acceleration is applied to the resonant frequency shift based physical quantity sensor 3, the oscillation frequency of the resonant frequency shift based physical quantity sensor 3 adjusts and a signal representing the oscillation frequency is outputted from the frequency ratio measuring device 7. This output is equivalent to a detection value of the acceleration by the physical quantity sensor module 1.

FIG. 7 also shows two cases with different input/output characteristics of the frequency ratio measuring device 7. The top of FIG. 7 shows the result of measuring the output from the physical quantity sensor module 1 before the adjustment of the input/output characteristic of the first low-pass filter. The bottom of FIG. 7 shows the result of measuring the output from the physical quantity sensor module 1 after the adjustment of the input/output characteristic of the first low-pass filter.

In both cases, an impact is applied in such a way that an acceleration is applied like an impulse at a timing of approximately 0.05 seconds. When an acceleration is applied to the resonant frequency shift based physical quantity sensor 3, an acceleration as a detection value of the physical quantity sensor module 1 adjusts. In both cases, this acceleration (detection value) adjusts with large amplitude and then gradually dies down. However, since the impulse waveform includes a broad range of frequency components, structure resonance is excited as well. The median of vibration immediately after the timing when the acceleration is applied (immediately after the vibration is applied) varies. That is, the output from the physical quantity sensor module 1 before the adjustment of the input/output characteristic of the first low-pass filter shown at the top of FIG. 7, the median of vibration drifts from the initial value immediately after the vibration is applied. The amount of this drift Δ (in FIG. 7, approximately 200 mG) is the vibration rectification error. The drift decreases as the median of vibration becomes closer to the initial value with the lapse of time. However, it is observed that the median is still not back to the initial value, at a point of 0.4 seconds at the right end of the graph.

Meanwhile, in the output from the physical quantity sensor module 1 after the adjustment of the input/output characteristic of the first low-pass filter shown at the bottom of FIG. 7, the median of vibration immediately after the vibration is applied is instantly converged into the initial value. It can be said that the drift component is reduced. That is, it can be said that the input/output characteristic, which is the relation between the frequency of the measurement target signal inputted to the frequency ratio measuring device 7 and the frequency of the output signal, shows nonlinearity and the amount of drift is thus controlled, thereby correcting the vibration rectification error.

Advantageous Effects

According to the first embodiment, changing the setting of the numbers of delays n1 to n4 as the numbers of filter taps of the first low-pass filter 20 and the second low-pass filter 60 can achieve so-called "reverse (line symmetry)" nonlinearity of the input/output characteristic of the frequency ratio measuring device 7 with respect to the applied acceleration and the oscillation frequency of the resonant frequency shift based physical quantity sensor 3. Thus, the nonlinearity of the measurement target signal as the output from the resonant frequency shift based physical quantity sensor 3 is corrected in such a way as to be offset by the "reverse" nonlinearity of the input/output characteristic of the frequency ratio measuring device 7. In the physical quantity sensor module 1 as a whole, the relation between the acceleration acting on the resonant frequency shift based physical quantity sensor 3 and the output can be made closer to linearity.

The first low-pass filter 20 and the second low-pass filter 60 are filters provided on the output side of the frequency delta-sigma modulator 10 and are not a dedicated circuit or a dedicated mechanism for correcting nonlinearity. Therefore, the nonlinearity of the physical quantity sensor can be corrected without increasing the size of the physical quantity sensor module 1.

Modification

In the first embodiment, the case of changing the setting of the numbers of delays n2 and n3 as the numbers of filter taps of the first low-pass filter 20 is described. However, the setting of the number of delays n1, and the number of delays n4 as the number of filter taps of the second low-pass filter 60, can be adjusted, too. In the first low-pass filter 20, the input signal is down-sampled by the decimator 32. Therefore, in the adjustment based on the number of delays n1 of the first delay element 24 preceding the decimator 32, even with the same number of delays, the amount of delay (delay time) of the smoothing timing is smaller than in the adjustment based on the numbers of delays n2 and n3 of the second delay element 34 and the third delay element 38. That is, the first low-pass filter 20 has the first delay element 24 having a number of filter taps that can slightly (finely) adjust the amount of adjust in the smoothing timing, and the second delay element 34 and the third delay element 38 having a number of filter taps that can greatly (roughly) adjust the amount of adjust. The first low-pass filter 20 thus can adjust the smoothing timing, based on a plurality of numbers of filter taps with different levels of roughness/fineness. This makes it easier to adjust the degree of correction of the measurement target signal as the output from the resonant frequency shift based physical quantity sensor 3.

Second Embodiment

Next, a second embodiment will be described. In the description below, differences from the first embodiment are mainly described. Components and elements similar to those of the first embodiment are denoted by the same reference signs and are not described repeatedly. The second embodiment is an embodiment of a physical quantity detector, which is the physical quantity sensor module 1 according to the first embodiment.

Figure 8:
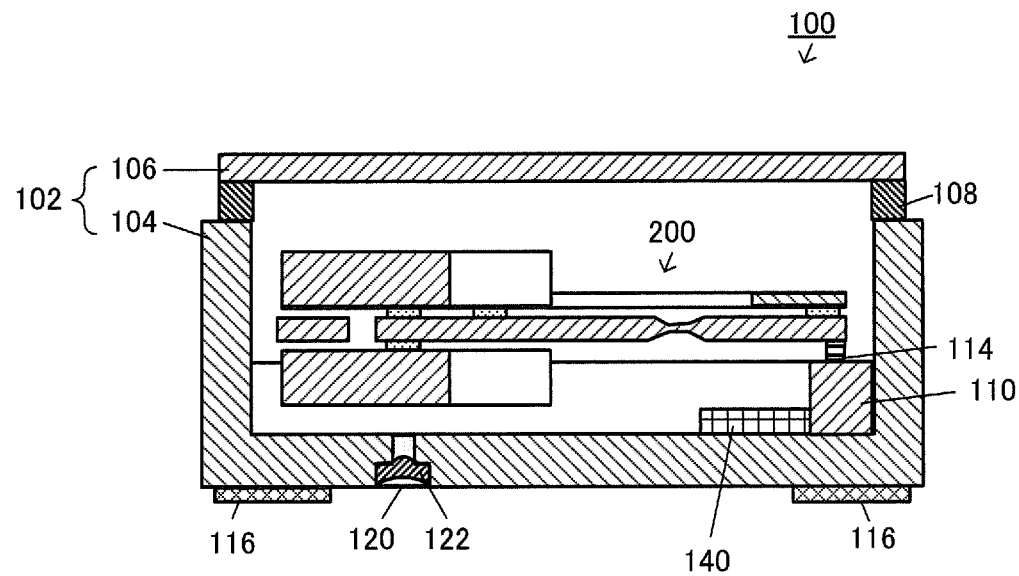
FIG. 8 is a schematic cross-sectional view of a physical quantity detector according to a second embodiment.

FIG. 8 is a cross-sectional view schematically showing an internal structure of a physical quantity detector 100 according to the second embodiment. The physical quantity detector 100 has a physical quantity detection device 200 as the resonant frequency shift based physical quantity sensor 3 in the first embodiment, an electronic circuit 140, and a package 102 accommodating the physical quantity detection device 200 and the electronic circuit 140.

The package 102 has a package base 104 and a lid 106. In the package 102, the plate-like lid 106 is coupled to the package base 104 via a lid joining member 108 in such a way as to cover the space above the recessed package base 104, thus defining an internal space. In this internal space, the physical quantity detection device 200 and the electronic circuit 140 are supported and fixed. The package base 104 can use, for example, a material such as ceramic, quartz crystal, glass, or silicon. The lid 106 can use, for example, the same material as the package base 104 or a metal such as an alloy of iron (Fe) and nickel (Ni), or stainless steel. The lid joining member 108 can use, for example, a seam ring, low-melting glass, or inorganic adhesive.

Inside the package base 104, a step part 110 for supporting and fixing the physical quantity detection device 200 on its upper surface is provided along an inner wall. On the upper surface of the step part 110, an internal terminal 114 electrically coupled to a fixed part coupling terminal of the physical quantity detection device 200 is provided.

On an outer bottom surface of the package base 104, an external terminal 116 used to install the physical quantity detector 100 on an external member is provided. The external terminal 116 is electrically coupled to the internal terminal 114 via an internal wiring, not illustrated. The internal terminal 114 and the external terminal 116 are made up of, for example, a metal film including a metalized layer of tungsten (W) or the like coated with nickel (Ni), gold (Au) or the like by plating or the like.

In a bottom part of the package base 104, a penetration hole 120 penetrating the package base 104 from the outer bottom surface to the inner bottom surface is formed. In the example shown in FIG. 8, the penetration hole 120 is in a stepped shape where the hole diameter on the outer side is greater than the hole diameter on the inner side. Inside the penetration hole 120, a sealing part 122 for airtightly sealing the inside (cavity) of the package 102 is provided. To provide the sealing part 122, for example, an alloy of gold (Au) and germanium (Ge) and a sealant made up of a solder or the like are arranged in the penetration hole 120, then heated and melted, and subsequently solidified. After the lid 106 is joined to the package base 104, the sealant is arranged in the penetration hole 120 in the state where the pressure inside the package 102 is reduced (the degree of vacuum is high), and the sealant is then heated and melted, and subsequently solidified to provide the sealing part 122. Thus, the inside of the package 102 can be airtightly sealed. The inside of the package 102 may be filled with an inert gas such as nitrogen, helium, or argon.

The electronic circuit 140 provides a drive signal to the physical quantity detection device 200 via the internal terminal 114 or the like, amplifies a supply frequency outputted from the physical quantity detection device 200 changing according to the applied physical quantity such as acceleration, and outputs the amplified supply frequency to outside of the physical quantity detector 100 via the external terminal 116. On the electronic circuit 140, the frequency ratio measuring device 7 and the reference signal oscillator 5 or the like in the first embodiment are equipped.

Figure 9:
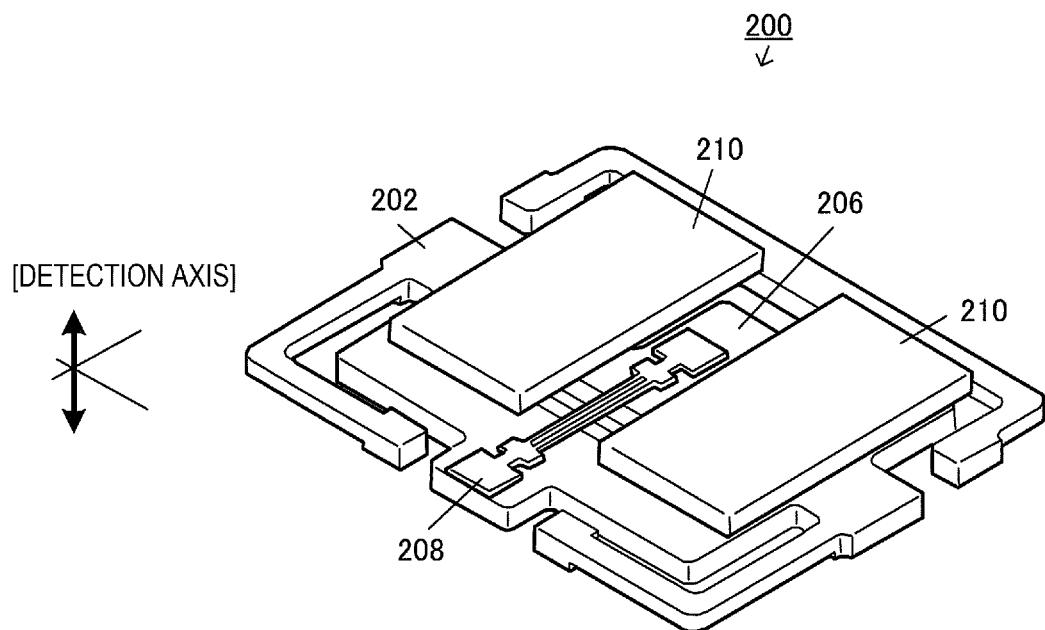
FIG. 9 is a schematic perspective view of a physical quantity detection device in the second embodiment.
Figure 10:
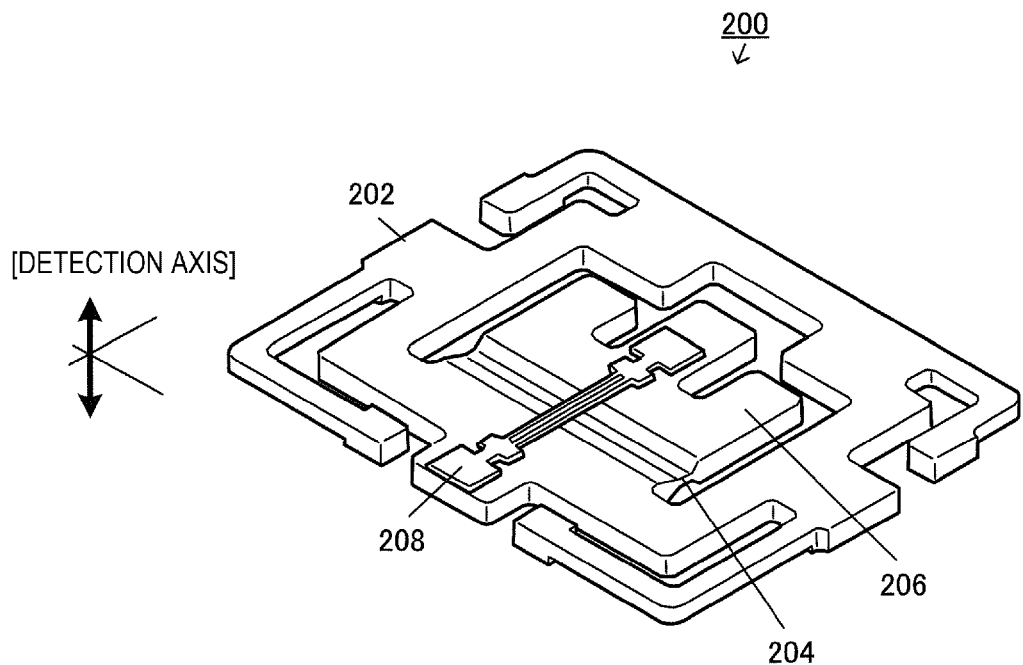
FIG. 10 is a schematic perspective view of the physical quantity detection device in the second embodiment.
Figure 11:
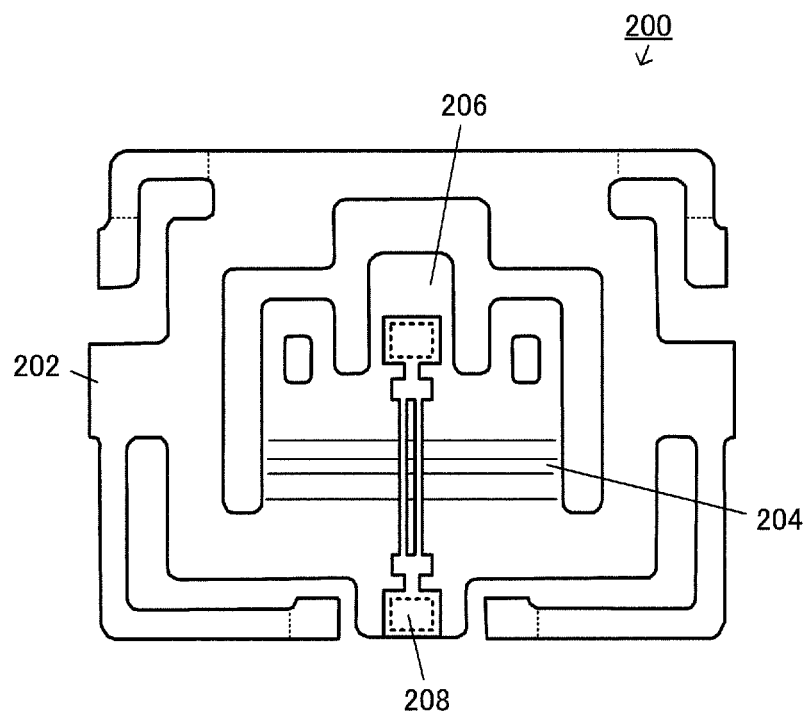
FIG. 11 is a plan view of the physical quantity detection device in the second embodiment.

FIGS. 9 and 10 are perspective views schematically showing the physical quantity detection device 200. In FIG. 10, the illustration of a mass part 210 is omitted in order to simplify the explanation. FIG. 11 is a plan view of the physical quantity detection device 200. The physical quantity detection device 200 has a base part 202 supported on four sides by a support part, a moving part 206 which is coupled by a joint part 204 extending from the base part 202 and which flexes due to an acceleration on a detection axis, and a physical quantity detection element 208.

The physical quantity detection element 208 is, for example, a dual tuning fork-like vibration element formed by patterning a quartz crystal substrate sliced out of a quartz crystal ore or the like at a predetermined angle, by photolithography or etching. Of course, the material of this element is not limited to quartz crystal. A piezoelectric material such as lithium tantalate, lithium tetraborate, lithium niobate, lead zirconate titanate, zinc oxide, or aluminum nitride can be used. Also, a semiconductor material such as silicon with a piezoelectric material coating such as zinc oxide or aluminum nitride can be used.

The physical quantity detection element 208 is formed as a beam extending over the joint part 204. One end side of the beam is fixed to the base part 202. The other end side is fixed to the moving part 206. A signal line (not illustrated) is coupled to both ends of the physical quantity detection element 208 and a predetermined current-voltage is applied thereto. The physical quantity detection element 208 is thus configured to vibrate at a predetermined frequency. When the moving part 206 flexes due to an acceleration generated along the measurement axis and causes a stress to act on the beam of the physical quantity detection element 208, the vibration frequency of the physical quantity detection element 208 adjusts. Based on the adjust in the vibration frequency, a signal corresponding to the acceleration is generated and outputted as an output signal from the physical quantity detection element 208.

Third Embodiment

Next, a third embodiment will be described. In the description below, differences from the first and second embodiments are mainly described. Components and elements similar to those of the first and second embodiments are denoted by the same reference signs and are not described repeatedly. The third embodiment is an embodiment of an acceleration physical quantity sensor using the physical quantity detector 100 according to the second embodiment.

Figure 12:
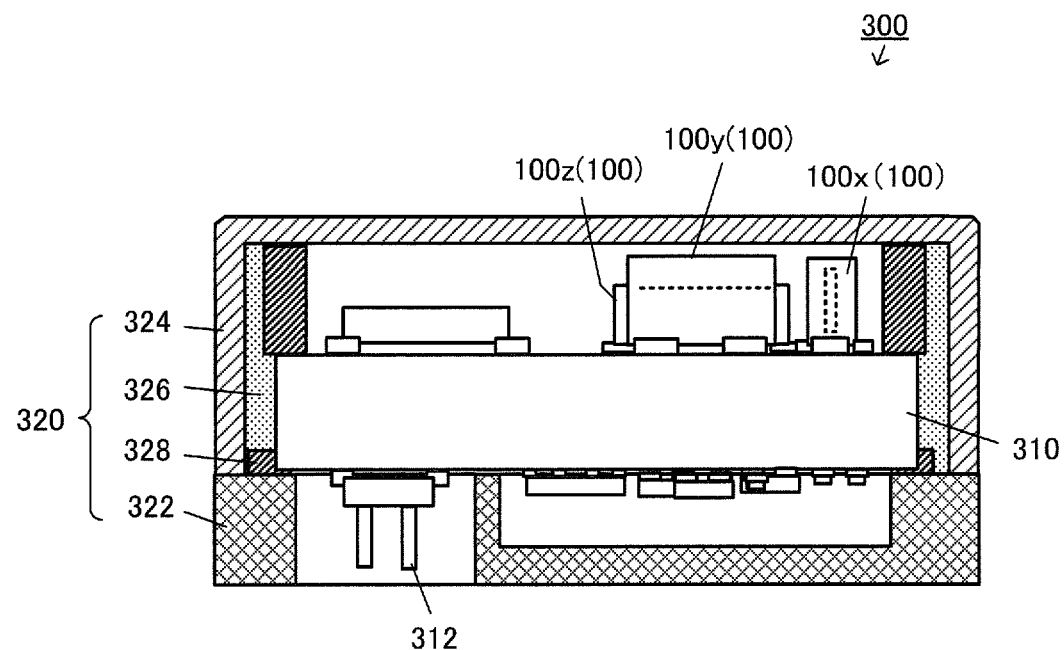
FIG. 12 shows the configuration of an acceleration physical quantity sensor according to a third embodiment.

FIG. 12 is a cross-sectional view schematically showing an internal structure of an acceleration physical quantity sensor 300 according to the third embodiment. The acceleration physical quantity sensor 300 has an electronic circuit board 310 and an accommodation section 320 accommodating the electronic circuit board 310.

In the accommodation section 320, an upper outer case 324 opening downward is placed on top of a lower outer case 322 and these are sealed together, defining an internal space. In the internal space of the accommodation section 320, the electronic circuit board 310 is supported and fixed via an inner case 326 and a packing 328.

On the electronic circuit board 310, three physical quantity detectors 100 (100x, 100y, 100z) according to the second embodiment of the same specifications, and an amplifier circuit or the like for amplifying an output signal from each physical quantity detector 100 (100x, 100y, 100z) are equipped.

The three physical quantity detectors 100x, 100y, 100z equipped on the electronic circuit board 310 are physical quantity sensors for detecting an acceleration as a physical quantity and output a signal corresponding to the acceleration detected along the detection axis. The three physical quantity detectors 100x, 100y, 100z are equipped in such a way that their detection axes are orthogonal to each other. The acceleration physical quantity sensor 300 is a so-called three-axis acceleration physical quantity sensor which detects an acceleration along three orthogonal axes.

Fourth Embodiment

Next, a fourth embodiment will be described. In the description below, differences from the first to third embodiments are mainly described. Components and elements similar to those of the first to third embodiments are denoted by the same reference signs and are not described repeatedly. The fourth embodiment is an embodiment of a clinometer using the acceleration physical quantity sensor 300 according to the third embodiment.

Figure 13:
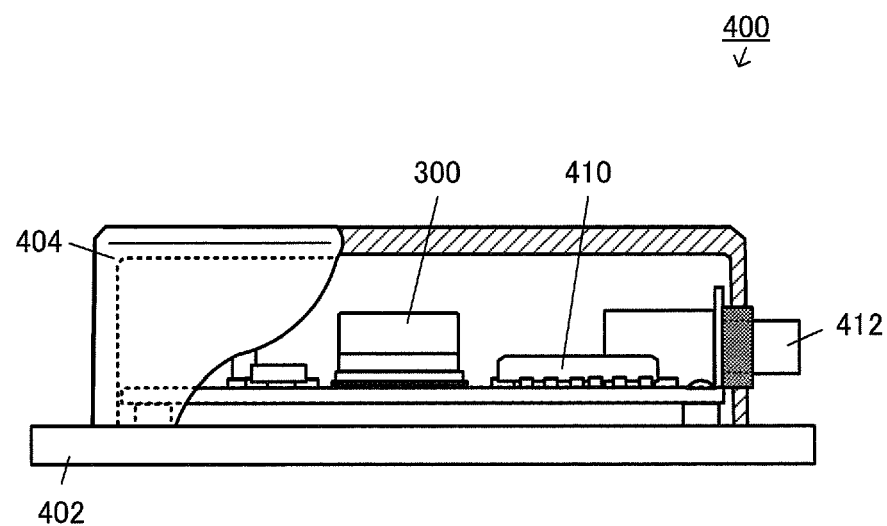
FIG. 13 is a schematic cross-sectional view of a clinometer according to a fourth embodiment.

FIG. 13 is a partly cross-sectional side view showing an example of the configuration of a clinometer 400 according to the fourth embodiment. The clinometer 400 is a device which outputs a signal corresponding to an angle of inclination at a position where the clinometer 400 is equipped. The clinometer 400 has the acceleration physical quantity sensor 300 according to the third embodiment, a calculator 410 which calculates an angle of inclination based on an output signal from the acceleration physical quantity sensor 300, and an external output terminal 412 which outputs to the outside a signal corresponding to the angle of inclination calculated by the calculator 410, in an internal space defined by a lower case 402 and an upper case 404. Of course, the clinometer 400 may include another element than these. For example, the clinometer 400 may include a built-in battery, a power supply circuit, a wireless device or the like.

The calculator 410 is a circuit which calculates an angle of inclination based on an output signal from the acceleration physical quantity sensor 300 and outputs a signal corresponding to the angle of inclination. The calculator 410 can be implemented, for example, by a general-purpose IC (integrated circuit) or FPGA (field-programmable gate array).

The clinometer 400 according to the fourth embodiment employs the acceleration physical quantity sensor 300 using the physical quantity sensor module 1 according to the first embodiment and therefore can achieve a higher inclination measurement accuracy than the related-art clinometer.

Fifth Embodiment

Next, a fifth embodiment will be described. In the description below, differences from the first to fourth embodiments are mainly described. Components and elements similar to those of the first to fourth embodiments are denoted by the same reference signs and are not described repeatedly. The fifth embodiment is an embodiment of an inertial measurement device using the acceleration physical quantity sensor 300 according to the third embodiment.

Figure 14:
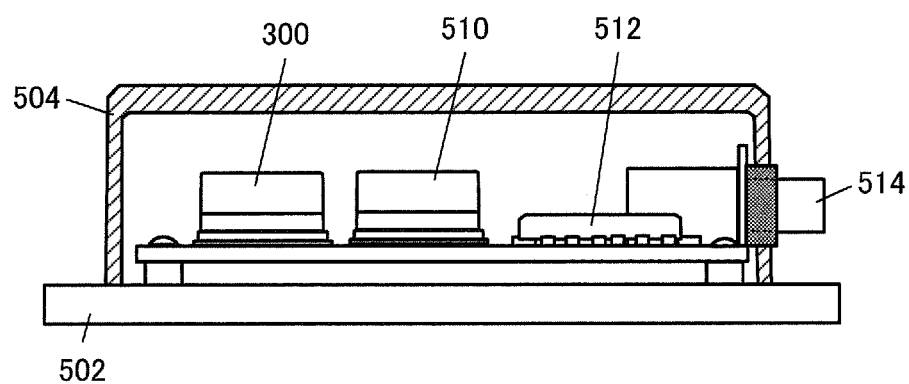
FIG. 14 is a schematic cross-sectional view of an inertial measurement device according to a fifth embodiment.

FIG. 14 is a partly cross-sectional side view showing an example of the configuration of an inertial measurement device 500 according to the fifth embodiment. The inertial measurement device 500 is a device equipped on a vehicle and has the acceleration physical quantity sensor 300 according to the third embodiment, an angular velocity physical quantity sensor 510, a circuitry 512 which calculates an attitude of the vehicle based on an output signal from the acceleration physical quantity sensor 300 and an output signal from the angular velocity physical quantity sensor 510, and an external output terminal 514 which outputs to the outside a signal corresponding to the attitude calculated by the circuitry 512, in an internal space defined by a lower case 502 and an upper case 504. Of course, the inertial measurement device 500 may include another element than these. For example, the inertial measurement device 500 may include a built-in battery, a power supply circuit, a wireless device or the like.

The angular velocity physical quantity sensor 510 is basically a so-called three-axis angular velocity physical quantity sensor having a configuration similar to the acceleration physical quantity sensor 300 and detecting an angular velocity about each of the X-axis, Y-axis, and Z-axis.

The circuitry 512 is implemented, for example, by a general-purpose IC (integrated circuit) or FPGA (field-programmable gate array). The circuitry 512 calculates an attitude of the vehicle on which the inertial measurement device 500 is equipped, based on an output signal from the acceleration physical quantity sensor 300 and an output signal from the angular velocity physical quantity sensor 510, and outputs a signal corresponding to the attitude.

Sixth Embodiment

Next, a sixth embodiment will be described. In the description below, differences from the first to fifth embodiments are mainly described. Components and elements similar to those of the first to fifth embodiments are denoted by the same reference signs and are not described repeatedly. The sixth embodiment is an embodiment of a structure monitoring device using the acceleration physical quantity sensor 300 according to the third embodiment.

Figure 15:
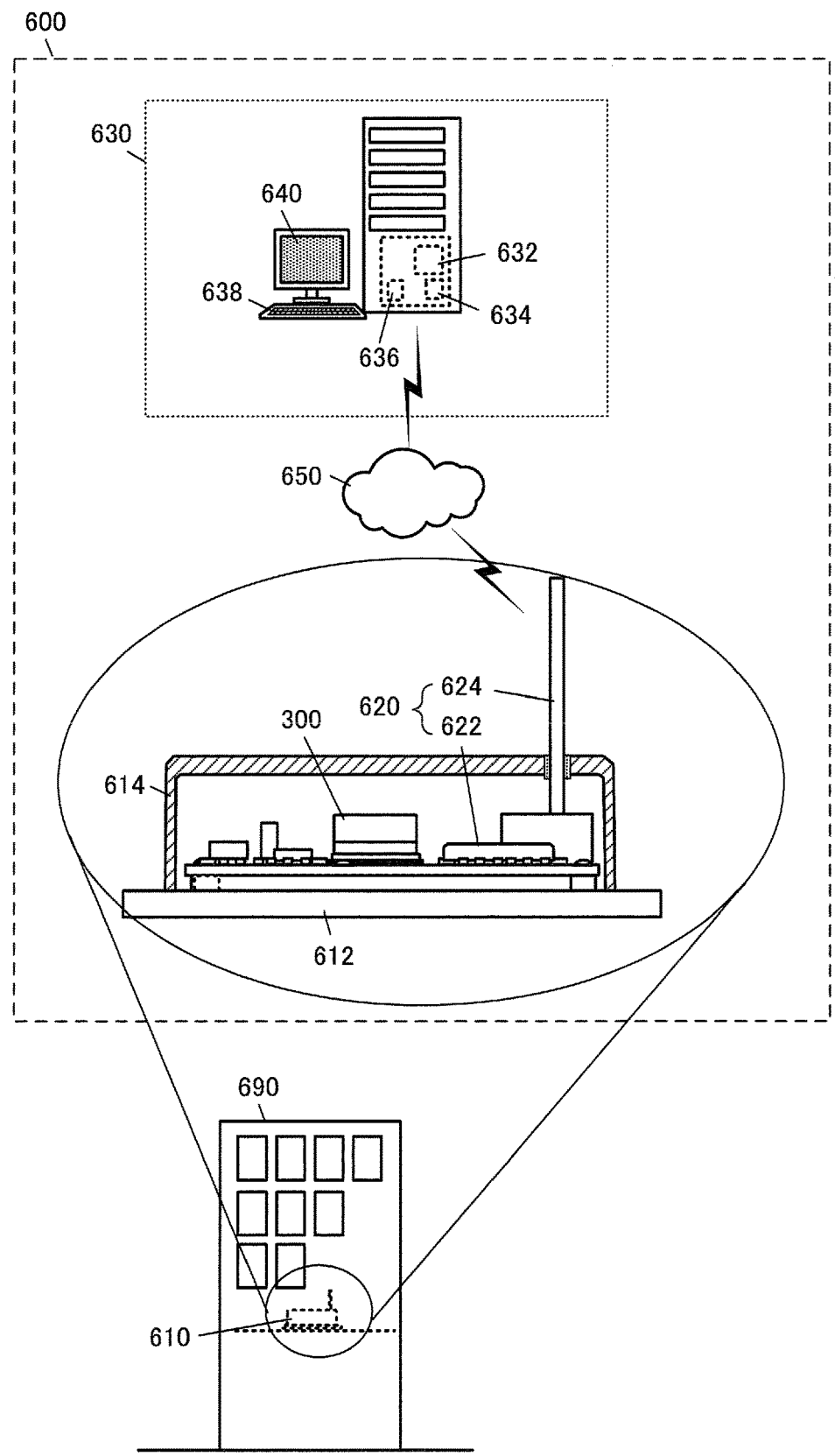
FIG. 15 is a schematic view showing the configuration of a structure monitoring device according to a sixth embodiment.

FIG. 15 shows an example of the configuration of a structure monitoring device 600 according to the sixth embodiment. The structure monitoring device 600 has the acceleration physical quantity sensor 300 according to the third embodiment equipped in a structure 690 as a monitoring target, a transmitter 620 which transmits a detection signal from the acceleration physical quantity sensor 300, a receiver 636 which receives a signal transmitted from the transmitter 620 via a communication network 650, and a calculator 632 which calculates an angle of inclination of the structure 690, based on a signal received by the receiver 636. The communication network 650 may be wired or wireless.

An acceleration physical quantity sensor unit 610 has the acceleration physical quantity sensor 300 according to the third embodiment, and the transmitter 620 including a communication module 622 and an antenna 644 to implement functions of a small communication terminal, in an internal space defined by a lower case 612 and an upper case 614. Of course, the transmitter 620 may be implemented as a separate communication module and antenna from the acceleration physical quantity sensor 300.

The calculator 632 in this embodiment is implemented by an ASIC (application-specific integrated circuit) or FPGA (field-programmable gate array) or the like equipped in a monitoring computer 630. However, the calculator 632 may be a processor such as a CPU (central processing unit), and the processor may arithmetically process a program stored in an IC memory 634, thus implementing a software-based configuration. The monitoring computer 630 can accept various operation inputs made by an operator via a keyboard 638 and display the result of arithmetic processing on a touch panel 640.

The receiver 636 is implemented by a wired communication device or wireless communication device connected to the communication network 650. In this embodiment, the receiver 636 is implemented by a communication module and antenna for wirelessly communicating with the transmitter 620. However, the receiver 636 may be implemented as a separate communication module and antenna from the monitoring computer 630.

Seventh Embodiment

Next, a seventh embodiment will be described. In the description below, differences from the first to sixth embodiments are mainly described. Components and elements similar to those of the first to sixth embodiments are denoted by the same reference signs and are not described repeatedly. The seventh embodiment is an embodiment of a vehicle using the acceleration physical quantity sensor 300 according to the third embodiment.

Figure 16:
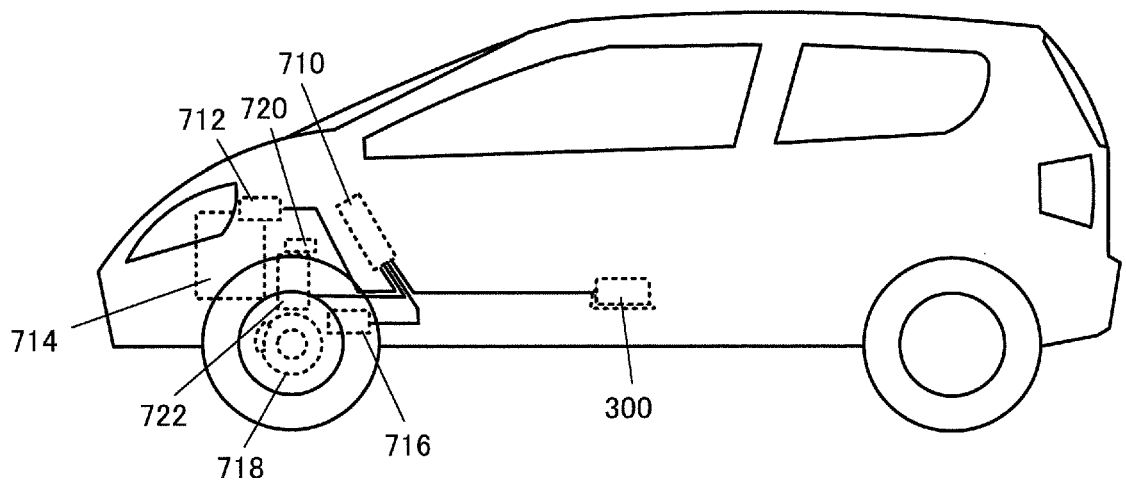
FIG. 16 is a schematic view showing the configuration of a vehicle according to a seventh embodiment.

FIG. 16 shows an example of the configuration of a vehicle 700 according to the seventh embodiment. While the vehicle 700 in this embodiment is described as a passenger car, the type of vehicle can be adjusted according to need. The vehicle 700 may also be a small ship, automatic transporter, on-site transporter car, forklift or the like.

The vehicle 700 has the acceleration physical quantity sensor 300 according to the third embodiment, and a controller 710 which controls at least one of acceleration, braking, and steering, based on a detection signal from the acceleration physical quantity sensor 300. The vehicle 700 can switch whether to execute automatic driving or not, based on a detection signal from the acceleration physical quantity sensor 300.

The controller 710 is implemented by an in-vehicle computer. The controller 710 is coupled to various physical quantity sensors and controllers such as the acceleration physical quantity sensor 300, a throttle controller 712, a brake controller 716, and a steering controller 720 in such a way as to be able to send and receive a signal via a communication network such as an in-vehicle LAN (local area network). The throttle controller 712 is a device which controls an output of an engine 714. The brake controller 716 is a device which controls the operation of a brake 718. The steering controller 720 is a device which controls the operation of a power steering 722. The type of the physical quantity sensor controller coupled to the controller 710 is not limited to these. Various other types can be set according to need.

The controller 710 causes a built-in arithmetic processor to perform arithmetic processing based on a detection signal from the acceleration physical quantity sensor 300, and determines whether to execute automatic driving or not. When executing automatic driving, the controller 710 transmits a control command signal to at least one of the throttle controller 712, the brake controller 716, and the steering controller 720, and controls at least one of acceleration, braking, and steering.

The content of automatic driving can be set according to need. For example, when the acceleration detected by the acceleration physical quantity sensor 300 during cornering reaches a threshold indicating that the vehicle is likely to spin out or veer off course, control to prevent the vehicle from spinning out or veering off course may be performed. Also, when the vehicle is parked but the acceleration detected by the acceleration physical quantity sensor 300 reaches a threshold indicating that it is likely that the vehicle has abruptly moved forward or backward due to an operation error, control to completely close the throttle and force a sudden braking may be performed.

The application of the disclosure is not limited to the above embodiments. Various adjusts can be made without departing from the scope and spirit of the disclosure.

What is claimed is:

1. A physical quantity sensor module comprising:
    a resonant frequency shift based physical quantity sensor whose frequency adjusts with a change in physical quantity;
    a reference signal oscillator which outputs a reference signal;
    a frequency delta-sigma modulator which performs frequency delta-sigma modulation of the reference signal, using an operation signal based on a measurement target signal outputted from the resonant frequency shift based physical quantity sensor, and generates a frequency delta-sigma modulated signal;
    a first filter provided at an output of the frequency delta-sigma modulator and operating synchronously with the measurement target signal;
    a second filter provided on an output side of the first filter and operating synchronously with the reference signal; and
    a latch provided between the first filter and the second filter and operating synchronously with the reference signal, wherein
    the resonant frequency shift based physical quantity sensor has nonlinearity as a characteristic of an output signal in response to the change in the physical quantity.

2. The physical quantity sensor module according to claim 1, wherein
    a cutoff frequency which is a filter characteristic achieved by a combination of the first filter and the second filter is lower than a structure resonance frequency of the resonant frequency shift based physical quantity sensor.

3. The physical quantity sensor module according to claim 2, wherein
    the structure resonance frequency is a frequency determined based on a structure of the resonant frequency shift based physical quantity sensor.

4. The physical quantity sensor module according to claim 1, wherein
    the first filter is set to have a characteristic such that the input/output characteristic is close to linear in the nonlinearity of the signal under measurement which is the output of the resonant frequency shift based physical quantity sensor.

5. The physical quantity sensor module according to claim 4, wherein
    the first filter is a smoothing filter configured to adjust a smoothing timing based on a number of filter taps, and the number of filter taps is set to a smoothing timing that reduces a vibration rectification error of the measurement target signal as the output from the resonant frequency shift based physical quantity sensor emerging due to the nonlinearity.

6. The physical quantity sensor module according to claim 5, wherein
    a setting of the number of filter taps is adjustable from outside.

7. The physical quantity sensor module according to claim 5, wherein the first filter is configured to adjust the smoothing timing based on a plurality of numbers of filter taps with different levels of roughness/fineness based upon an amount of change in the smoothing timing.

8. The physical quantity sensor module according to claim 1, wherein
    the physical quantity is acceleration.

9. A clinometer comprising:
    the physical quantity sensor module according to claim 8; and
    a calculator which calculates an angle of inclination based on an output signal from the physical quantity sensor module.

10. A structure monitoring device comprising:
    the physical quantity sensor module according to claim 8 equipped on a structure;
    a transmitter which is equipped on the structure and transmits an output from the physical quantity sensor module;
    a receiver which receives a signal transmitted from the transmitter; and
    a calculator which calculates an angle of inclination of the structure, based on a signal received by the receiver.

* * * * *